(12) United States Patent
Li et al.

(10) Patent No.: US 11,594,440 B2
(45) Date of Patent: Feb. 28, 2023

(54) REAL TIME BIAS DETECTION AND CORRECTION FOR ELECTROSTATIC CHUCK

(71) Applicant: Applied Materials, Inc., Santa Clara, CA (US)

(72) Inventors: Jian Li, Fremont, CA (US); Juan Carlos Rocha-Alvarez, San Carlos, CA (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/076,178

(22) Filed: Oct. 21, 2020

(65) Prior Publication Data

US 2022/0122874 A1   Apr. 21, 2022

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32082* (2013.01); *H01L 21/68714* (2013.01)

(58) Field of Classification Search
CPC ............ H01L 21/6833; H01L 21/68714; H01J 37/32082
See application file for complete search history.

(56) References Cited

U.S. PATENT DOCUMENTS

| 5,933,314 A * | 8/1999 | Lambson | ............ H01L 21/6833 |
| | | | 279/128 |
| 2016/0027615 A1* | 1/2016 | Ishiguro | ............ H01J 37/32082 |
| | | | 156/345.28 |

FOREIGN PATENT DOCUMENTS

| JP | H10-27566 A | 1/1998 |
| JP | 10189697 A * | 7/1998 |
| JP | H10-189697 A | 7/1998 |
| KR | 10-2055673 B1 | 12/2019 |
| WO | 99-00889 A1 | 1/1999 |

OTHER PUBLICATIONS

International Search Report and Written Opinion dated Feb. 7, 2022 in International Patent Application No. PCT/US2021/055332, 10 pages.

* cited by examiner

*Primary Examiner* — Binh X Tran
(74) *Attorney, Agent, or Firm* — Kilpatrick Townsend & Stockton LLP

(57) ABSTRACT

A method reduces differences in chucking forces that are applied by two electrodes of an electrostatic chuck, to a substrate disposed atop the chuck. The method includes providing initial chucking voltages to each of the two electrodes, and measuring an initial current provided to at least a first electrode of the two electrodes. The method further includes initiating a process that affects a DC voltage of the substrate, then measuring a modified current provided to at least the first electrode, and determining, based at least on the initial current and the modified current, a modified chucking voltage for a selected one of the two electrodes, that will reduce chucking force imbalance across the substrate. The method also includes providing the modified chucking voltage to the selected one of the two electrodes.

13 Claims, 6 Drawing Sheets

REAL TIME BIAS DETECTION AND CORRECTION FOR ELECTROSTATIC CHUCK

TECHNICAL FIELD

The present technology relates to components, apparatuses and methods for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The substrate support may also be utilized in some technologies to develop a substrate-level plasma. Plasma generated near the substrate may transfer electric charge to the substrate, changing the voltage level of the substrate relative to its surroundings (this voltage is referred to hereinafter as $V_{DC}$).

SUMMARY

In one or more embodiments, a method reduces differences in chucking forces that are applied by two electrodes of an electrostatic chuck, to a substrate disposed atop the chuck. The method includes providing initial chucking voltages to each of the two electrodes, and measuring an initial current provided to at least a first electrode of the two electrodes. The method further includes initiating a process that affects a DC voltage of the substrate, then measuring a modified current provided to at least the first electrode, and determining, based at least on the initial current and the modified current, a modified chucking voltage for a selected one of the two electrodes, that will reduce chucking force imbalance across the substrate. The method also includes providing the modified chucking voltage to the selected one of the two electrodes.

In one or more embodiments, a bipolar electrostatic chuck system with chucking force compensation includes an electrostatic chuck body, two power sources, at least one ammeter, and a controller. An insulative substrate support surface is disposed atop the electrostatic chuck body, and two electrodes are disposed atop at least a portion of the electrostatic chuck body, and below the insulative substrate support surface. Each of the two power sources is operable to provide a DC voltage output to a corresponding one of the electrodes, and at least one of the two power sources is operable to adjust its DC voltage output in response to an input signal. The ammeter is coupled in series electrical connection with a first one of the electrodes, and is configured to measure electrical current flowing to the first electrode, and provide current information indicating the electrical current. The controller is configured to receive the current information from the ammeter, and to provide voltage correction information as the input signal to the at least one of the two power sources that is adjustable, based at least in part on the current information, to at least partially reduce a difference in chucking force applied by the two electrodes.

In one or more embodiments, a substrate processing system includes chucking force compensation. The system includes a process chamber operable to process a substrate, and an electrostatic chuck body disposed within the process chamber. An insulative substrate support surface is disposed atop the electrostatic chuck body, and first and second electrodes are disposed atop at least a portion of the electrostatic chuck body, and below the insulative substrate support surface. The system further includes first and second power sources and first and second ammeters. Each power source is operable to provide a DC voltage output to a corresponding one of the electrodes, and each of the two power sources is operable to adjust its DC voltage output in response to an input signal. The first ammeter is coupled in series electrical connection between the first power source and the first electrode, and the second ammeter is coupled in series electrical connection between the second power source and the second electrode. Both of the ammeters are configured to measure electrical current flowing between the respective power source, and the respective electrode, that they are coupled between, and provide current information indicating the electrical current. The system further includes a controller that is configured to load a wafer onto the insulative substrate support surface, to operate the first and second power sources to provide initial DC voltages to the respective first and second electrodes, to receive initial first and second current information from the first and second ammeters, respectively, and to initiate a process within the process chamber. The controller is also configured to receive modified first and second current information from the first and second ammeters, respectively, after the process is initiated, to determine modified DC voltage values for the first and second power supplies, based at least in part on the initial and the modified current information, and to operate the first and second power sources to provide modified DC voltages to the respective first and second electrodes, to at least partially reduce a difference in chucking force applied by the two electrodes.

BRIEF DESCRIPTION OF THE DRAWINGS

A further understanding of the nature and advantages of the disclosed technology may be realized by reference to the remaining portions of the specification and the drawings.

Figure 1:
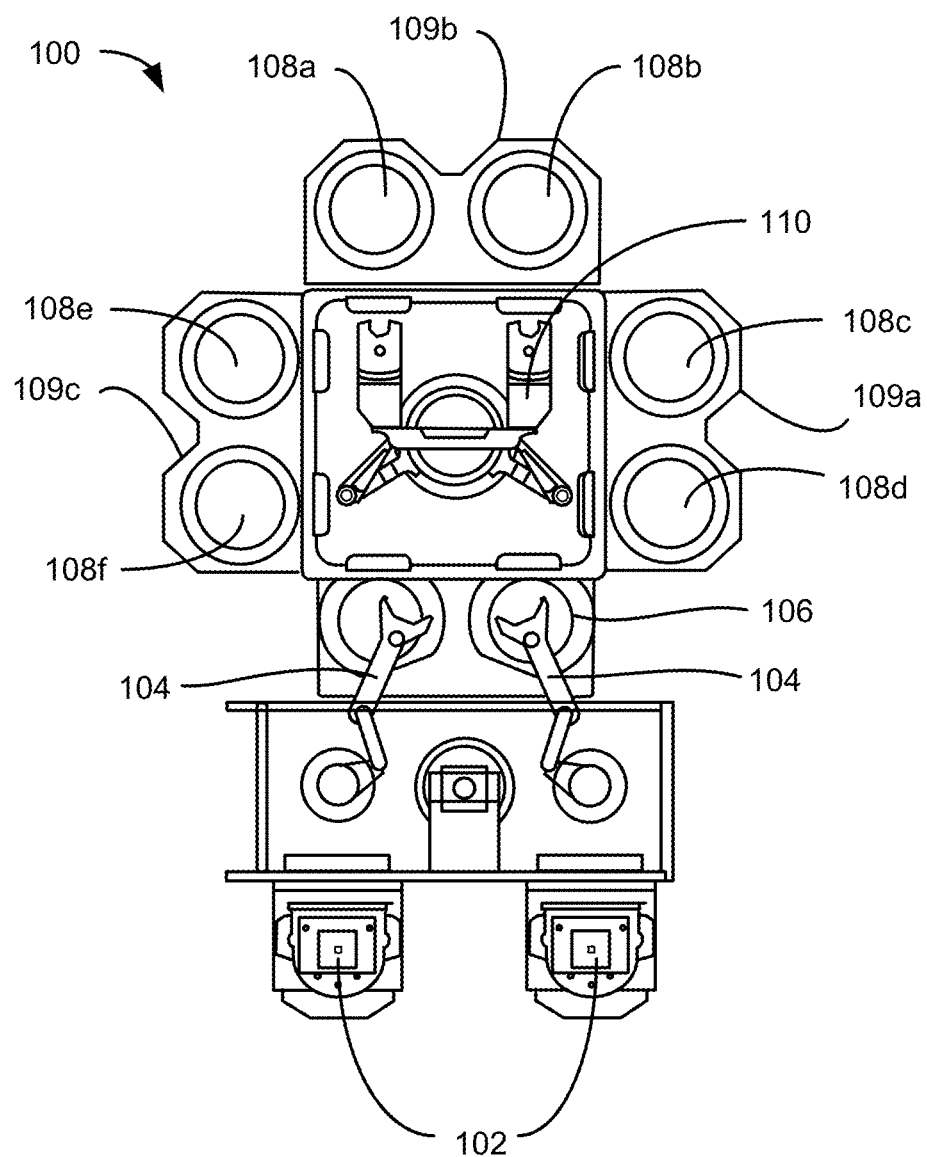
FIG. 1 is a top plan view illustrating an exemplary processing system, according to one or more embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processes, including plasma processes, may energize one or more constituent precursors to process a substrate. These processes may cause stresses on the substrate. For example, in the development of dielectric layers for vertical memory applications, such as oxide/nitride (ON) stacks, many layers of material may be deposited on a substrate. These layers of material may be characterized by internal stresses that act upon the substrate. This may cause a substrate to bow during processing, which can lead to photolithography focus issues, poor uniformity of shape formation, and/or device damage or malfunction.

An electrostatic chuck may be used to secure a substrate in a specific position for processing, and may, for example, exert a clamping force against a substrate to overcome a bowing stress. However, as device stacks increase in complexity and/or numbers of layers, the stresses acted upon the substrate can increase, which may require a proportional increase in chucking voltage. Additionally, many of these films may be developed at relatively high temperatures that further affect components of the chamber. For example, some deposition activities may occur at temperatures above 500° C. or higher, which may affect (and generally reduce) resistivity of chamber components, such as the materials forming the electrostatic chuck. As resistivity of a material reduces, current leakage may increase. When compounded with the increased voltages used to overcome the bowing stresses exerted on the substrate with increased deposition layers, electric arcs may be produced, which can damage substrates and chamber components. These issues have tended to reduce useful chucking voltage windows to narrower ranges than desired.

Some technologies use a monopolar electrostatic chuck. While such chucks may provide chucking force to stabilize a substrate during processing, the chucks may be otherwise limited, and may contribute to issues with processing. For example, monopolar chucks may cause substrate movement, which can impact process uniformity by shifting a chuck from a desired location within the processing chamber. This is because a monopolar chuck utilizes plasma generated during the process to create electrostatic force on the substrate. When the substrate is placed on a pedestal in an initial location, and a monopolar chuck within the pedestal is initially engaged, the wafer may be electrically floating relative to the DC power source of the chucking electrode, because the pedestal body may be coated with an insulator. When a plasma is generated, the plasma may ground the substrate, which may effectively complete the circuit and create an electrostatic force between the substrate and pedestal body. However, the plasma generation, vibration or other causes may cause movement of the substrate from the desired initial location before the electrostatic force is activated, which may impact uniformity during processing.

Bipolar chucks may include two semicircular electrodes, which may overcome issues with the monopolar chuck by coupling one electrode at positive voltage and one at negative voltage. Before processing begins, the substrate will still be characterized by a net neutral charge, but the charge within the substrate will locally redistribute according to the electric fields near the electrodes, so that the substrate may be clamped to the substrate support. However, as processing temperatures are raised, leakage through the chuck body may increase, which may increase a likelihood of DC discharge between the two electrodes. Also, processing may change the DC voltage of the substrate, such that the electric field near one of the electrodes will be reduced and the field near the other electrode will be increased. Plasma processing is one type of process that can change DC voltage of a substrate; and other types of processing and/or metrology can expose a substrate to charged particles that can add or subtract charge from the substrate, changing its average DC voltage. Factors such as types of process gases used, DC voltage differentials between the wafer chuck and other system components, presence of a plasma or other ionized particle sources, temperature, and so forth can all affect how much the DC voltage of a substrate changes during processing. When a bipolar chuck is used, a DC voltage change can lead to significantly more force on one side of the wafer as compared with the other, which can lead to nonuniform processing and/or substrate damage due to stress around particles that may already be on the chuck, or on the backside of the wafer. Stress is particularly important to avoid when processing thinned wafers. Present day technologies often process semiconductor wafers that are 12 inches or more in diameter, which wafers may be too thick for the circuits thus produced to fit into very small packages. For some products, wafer thinning is sometimes required near the end of wafer processing but before such processing is complete, with the thinned wafers being at risk of damage or breakage when subjected to high forces.

DC voltage of a substrate can be directly measured in some, but not all, processing configurations. For example, some processing configurations place a DC probe so as to make contact with a backside of the substrate, and connect the substrate directly to a voltmeter. However, this is not always possible, because some processing configurations (e.g., deposition chambers) operate with cleaning cycles in between substrate processing cycles, without substrates covering the chuck. The gases and/or plasmas used in such cleaning cycles can destroy a DC probe. It is also possible to measure DC voltage directly using a Langmuir probe, but such probes, also, may not survive processing conditions, and/or may locally disturb processing conditions, leading to nonuniform processing.

The present technology overcomes these challenges with substrate support assemblies having bipolar chucking capabilities and provisions for indirectly estimating, and at least partially compensating for, DC voltage changes induced by processing. These provisions thus balance chucking forces, helping to avoid extremely high forces. The indirect measurement is provided by leakage currents measured at the bipolar chuck electrode power sources. Some components of such leakage currents are independent of DC voltage of the substrate, while others are proportional to such DC voltage. That is, even though the electrostatic chuck and components therein are nominally insulated from each other and the substrate, some leakage through various insulative layers, and/or top coating, of the chuck can occur. For example, leakage can occur among chuck electrodes and internal heating elements. By characterizing the relationship between DC voltage of the substrate and such leakage currents, then measuring such leakage currents during processing, the present technology provides an estimate of the DC voltage of the substrate and makes a correction to the power sources driving the electrodes. Thus, in certain embodiments, an estimate of $V_{DC}$ is generated, and clamping biases applied to regions of a bipolar electrostatic chuck are adjusted so that the chucking forces are more balanced. The balanced chucking forces help to (1) keep the substrate being processed flatter, (2) avoid damage to the substrate that may be caused by higher chucking force than necessary on one side of the substrate, and/or (3) improve uniform thermal coupling with the chuck surface, thus enhancing process uniformity.

Although this disclosure may identify specific deposition processes utilizing the disclosed technology, it will be readily understood that the systems and methods are equally applicable to other deposition, etching, and cleaning chambers, as well as processes as may occur in the described chambers, and other chambers. Accordingly, the technology should not be considered to be limited as for use with these specific deposition processes or process chambers alone. The disclosure will discuss one or more possible process chamber configurations that may include bipolar electrostatic wafer chuck(s) according to embodiments of the present technology, before additional variations and adjustments according to embodiments of the present technology are described.

FIG. 1 is a top plan view illustrating one embodiment of an exemplary processing system 100 that may include deposition, etching, baking, and/or curing chambers, according to one or more embodiments. In the figure, one or more front opening unified pods (FOUPs) 102 supply substrates that are received by robotic arms 104 and placed into a low pressure holding area 106 before being placed into one of substrate processing chambers 108a-f, positioned in tandem sections 109a-c. Wafers upon which semiconductors are to be fabricated are shown as the substrates in this system example, but other types of substrates are possible. A second robotic arm 110 may be used to transport the substrate wafers from the holding area 106 to any of the substrate processing chambers 108, optionally to other substrate processing chambers 108, and/or back to one of the FOUPs 102. Each substrate processing chamber 108 can be outfitted to perform a number of substrate processing operations, including formation of one or more semiconductor material layers, in addition to plasma-enhanced chemical vapor deposition, atomic layer deposition, physical vapor deposition, etch, pre-clean, degas, orientation, annealing, ashing, and/or other processes.

Each of the substrate processing chambers 108 may include one or more system components for processing, such as depositing, annealing, curing and/or etching a dielectric or other film on a substrate, and each substrate processing chamber 108 may thus include a pedestal or substrate holder to position the substrate for processing. The substrate holder may be a bipolar electrostatic chuck, as discussed further below. In one configuration, two pairs of the processing chambers, e.g., 108c-d in tandem section 109a, and 108e-f in tandem section 109c, may be used to deposit dielectric material on the substrate, and the third pair of processing chambers, e.g., 108a-b in tandem section 109b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by processing system 100.

Figure 2:
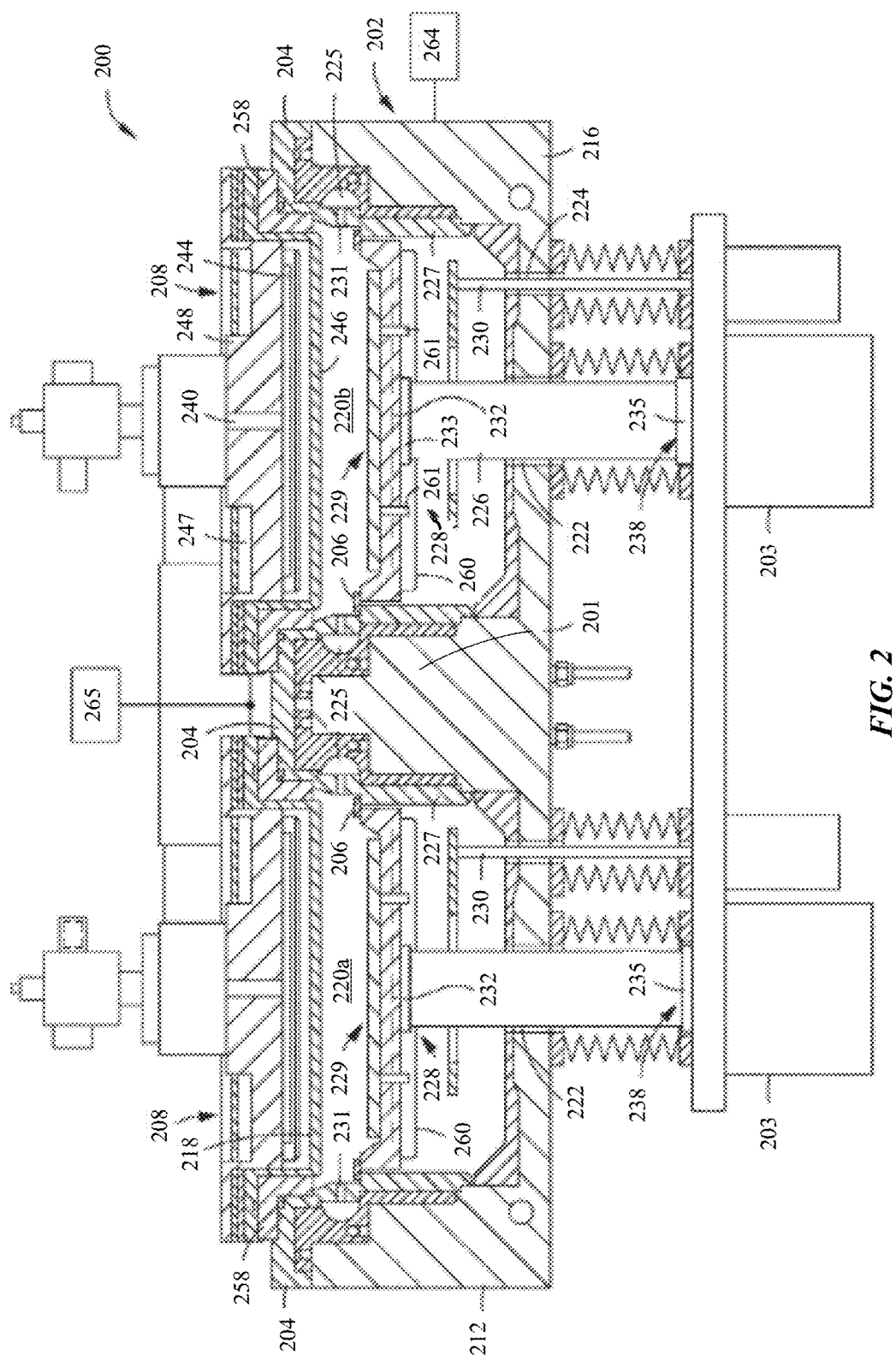
FIG. 2 is a schematic cross-sectional view illustrating a portion of an exemplary substrate processing system, according to one or more embodiments of the present technology.

FIG. 2 is a schematic cross-sectional view illustrating a portion of an exemplary substrate processing system 200, according to one or more embodiments of the present technology. Substrate processing system 200 may illustrate a pair of substrate processing chambers 108 that may be fitted in one or more of tandem sections 109 described above, and which may include substrate support assemblies according to embodiments of the present technology. Each substrate processing chamber 108 may be configured for plasma related processing, for example plasma enhanced deposition, plasma etching, cleaning, photoresist ashing, and the like, without limitation. Alternatively, substrate processing chambers 108 may be configured for other types of substrate processing, as discussed further below. The substrate processing system 200 generally may include a chamber body 202 having sidewalls 212, a bottom wall 216, and an interior sidewall 201 defining a pair of processing regions 220a and 220b. Each of the processing regions 220a-220b may be similarly configured, and may include identical components. In FIG. 2, some features that may be present for each of the chambers are only labeled by number within one of the chambers, for clarity of illustration.

For example, processing region 220b, the components of which may also be included in processing region 220a, may include a pedestal 228 disposed in the processing region through a passage 222 formed in the bottom wall 216 in the substrate processing system 200. Pedestal 228 may include a bipolar electrostatic chuck, as described further below, to hold a substrate 229 in place on an exposed, insulative surface of pedestal 228. Pedestal 228 may include heating elements 232, for example resistive heating elements, which may heat and control temperature of a substrate 229 to a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220b. The stem 226 may also include electrical power interfaces to provide electrical power to the pedestal 228 or other components therein. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220b and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220b through a substrate transfer port 260.

A chamber lid 204 may be coupled with a top portion of the chamber body 202. The lid 204 may accommodate one or more precursor distribution systems 208 coupled thereto.

The precursor distribution system 208 may include a precursor inlet passage 240 which may deliver reactant and cleaning precursors through a dual-channel showerhead 218 into the processing region 220b. The dual-channel showerhead 218 may include an annular base plate 248 having a blocker plate 244 disposed intermediate to a faceplate 246. A power source 265 may be coupled with the dual-channel showerhead 218, which may power the dual-channel showerhead 218 to facilitate generating a plasma region between the faceplate 246 of the dual-channel showerhead 218 and the pedestal 228. (AC sources that ignite or sustain a plasma will be designated as "RF" sources herein, notwithstanding that the frequencies at which such sources operate, may be arguably within the radio frequency or microwave frequency spectrum.) In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the annular base plate 248 may be maintained at a predefined temperature. A liner assembly 227 may be disposed within the processing region 220b in close proximity to the sidewalls 201, 212 of the chamber body 202 to prevent exposure of the sidewalls 201, 212 to the processing environment within the processing region 220b. The liner assembly 227 may include a circumferential pumping cavity 225, which may be coupled to a pumping system 264 configured to exhaust gases and byproducts from the processing region 220b and control the pressure within the processing region 220b. A plurality of exhaust ports 231 may be formed on the liner assembly 227. The exhaust ports 231 may be configured to allow the flow of gases from the processing region 220b to the circumferential pumping cavity 225 in a manner that promotes processing within the substrate processing system 200.

Figure 3:
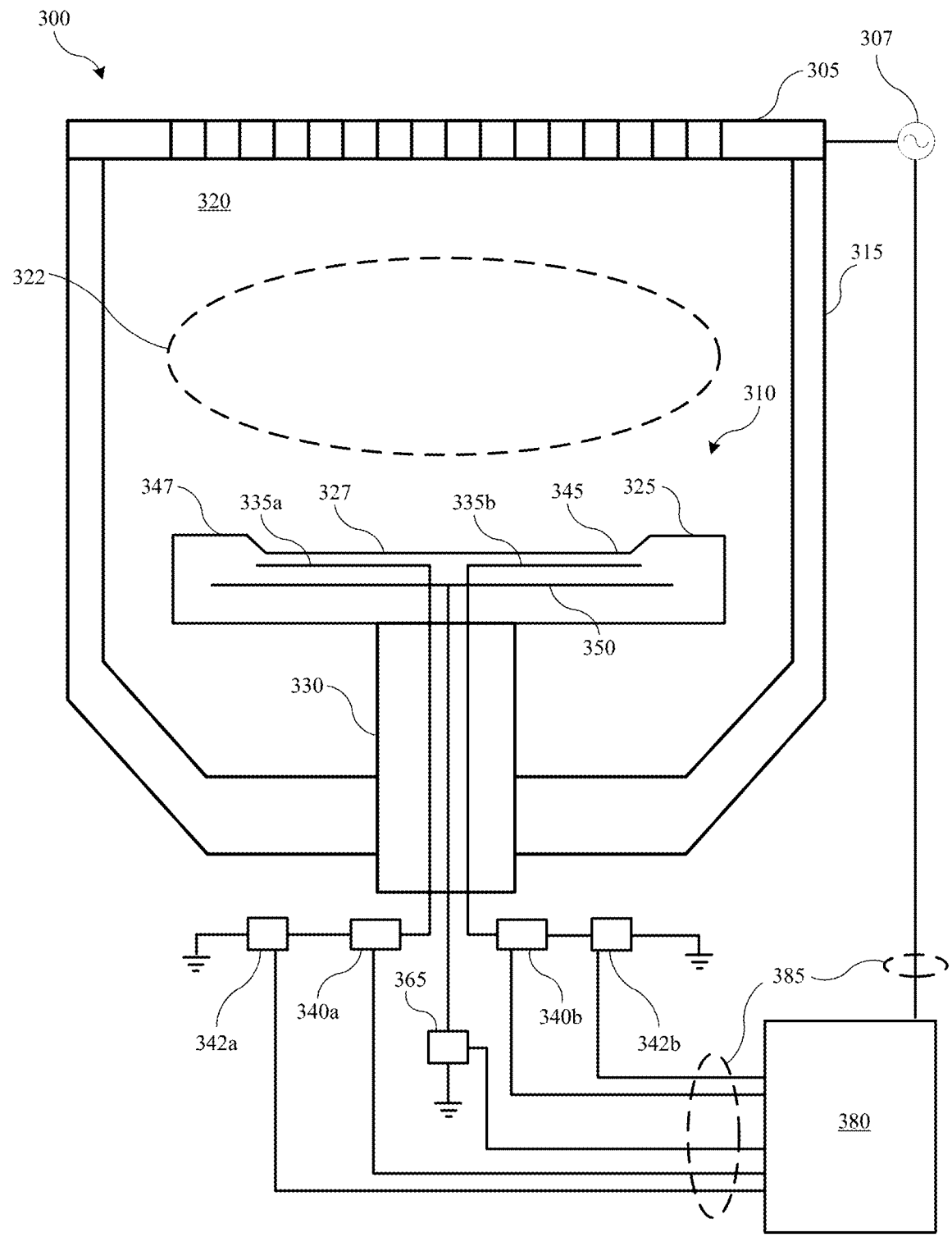
FIG. 3 is a schematic, partial cross-sectional view of an exemplary substrate processing chamber, according to one or more embodiments of the present technology.

FIG. 3 is a schematic, partial cross-sectional view of an exemplary substrate processing chamber 300, according to one or more embodiments of the present technology. Substrate processing chamber 300 may include substrate support assemblies according to embodiments of the present technology, and may illustrate features that can be used in or with substrate processing chambers 108 that may be fitted in one or more of tandem sections 109 described above. FIG. 3 may also include one or more components discussed above with regard to FIG. 2, and may illustrate further details relating to that chamber. The substrate processing chamber 300 may be used to perform semiconductor processing operations including deposition of stacks of dielectric materials as previously described. Substrate processing chamber 300 may show a partial view of a processing region of a semiconductor processing system, and may not include all of the components, such as additional lid stack components previously described, which are understood to be incorporated in some embodiments of substrate processing chamber 300.

As noted, FIG. 3 may illustrate a portion of a substrate processing chamber 300. Substrate processing chamber 300 may include a showerhead 305, as well as a substrate support 310. Along with chamber sidewalls 315, the showerhead 305 and the substrate support 310 may define a substrate processing region 320 in which a plasma 322 may be generated. Substrate support 310 may include an electrostatic chuck body 325, which may include one or more components embedded or disposed within the body. The components incorporated within the top puck may not be exposed to processing materials in some embodiments, and may be fully retained within the electrostatic chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the electrostatic chuck body 325. Electrostatic chuck body 325 may include associated channels or components to operate as an electrostatic chuck, although in some embodiments the assembly may also operate as or include components for a vacuum chuck, or any other type of chucking system. Stem 330 may be coupled with the chuck body on a second surface of the chuck body opposite the substrate support surface.

Electrostatic chuck body 325 may include first and second, electrically conductive chucking electrodes 335a and 335b, which may be embedded within electrostatic chuck body 325 proximate substrate support surface 327. Electrodes 335a and 335b may be electrically coupled with respective DC power sources 340a and 340b, as shown, which may be configured to provide energy or voltage to the electrically conductive chucking electrodes 335a, 335b in a bipolar chucking configuration. That is, electrodes 335a and 335b are typically driven to positive and negative voltages with respect to the potential of a substrate placed thereon. Chucking electrodes 335a and/or 335b may be relatively continuous over respective portions of electrostatic chuck body 325, or may form apertures therethrough (for example, each electrode 335 may be a mesh). For brevity hereinafter, chucking electrodes may be referred to as simply electrodes. Electrodes 335a, 335b may be operated to form a plasma 322, from a precursor within a substrate processing region 320 of the substrate processing chamber 300, although other plasma operations may similarly be sustained. For example, electrodes 335a, 335b may operate as AC electrical grounds for a capacitive plasma system including an RF source 307 electrically coupled with showerhead 305. For example, electrodes 335a, 335b may operate as ground paths for power from RF source 307, while also providing DC electrical biases with respect to the substrate, to provide bipolar electrostatic clamping of the substrate to substrate support surface 327. Power sources 340a and 340b may include filters, power sources, and a number of other electrical components configured to provide a chucking voltage. Power sources 340a and 340b may also include internal ammeters operable to determine a current supplied to electrodes 335a, 335b. Optionally, and especially when power sources 340a and 340b do not include internal ammeters, separate ammeters 342a and 342b may be present, coupled in electrical series connection with electrodes 335a, 335b and operable to determine currents supplied to electrodes 335a, 335b. Additional electrical components and details about bipolar chucks according to some embodiments will be described further below, and any of the designs may be implemented with substrate processing chamber 300. For example, additional plasma related power supplies or components may be incorporated as will be explained further below.

Control and/or data lines may connect any of power sources 340a, 340b, optional ammeters 342a, 342b, heater power supply 365, RF source 307, and/or other features of a plasma processing system that includes substrate processing chamber 300, may connect with a controller 380 through data lines 385. Controller 380 may, without limitation, receive data, store data, request, receive and/or store user input, perform calculations using any combination of data and/or user input, and/or send control signals to start, stop, and/or adjust operation of power sources 340a, 340b, heater power supply 365, RF source 307, other capabilities of substrate processing chamber 300, and/or other capabilities of a larger system that includes chamber 300. That is, controller 380 may be a dedicated controller for executing the control techniques described herein, or may be part of a system controller for substrate processing chamber 300 and/or other portions of a processing system (e.g., one or more of substrate processing chambers 108, robotic arms 104, 110, low pressure holding area 106, or any other features of processing system 100, FIG. 1). Any of the above-described variations of controller 380 may be implemented as a stand-alone controller that performs all of the functions described, or as a distributed controller that performs some of the described functions in one location and some of the functions in another location. Controller 380 may be physically located in a housing or cabinet with substrate processing chamber 300 (or with a system that includes chamber 300) or may be physically located remotely, with data lines 385 being any combination of discrete electronic connections, data bus connections, network connections, wireless (e.g., radio, Bluetooth, optical) connections and the like, between or among the physical components of chamber 300 and controller 380. Controller 380 may be implemented by any suitable combination of logic devices, microcontrollers, microprocessors and the like. Upon reading and understanding the present disclosure, one skilled in the art will readily conceive of various equivalents, extensions, variation and/or modifications of the specific implementations of controller 380 discussed above.

Electrostatic chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater, in some embodiments. In some embodiments the electrodes 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a heater power supply 365, which may provide current to a resistive heating element to facilitate heating of the associated chuck body and/or substrate. Heater 350 may include multiple heaters in embodiments, and each heater may be associated with a zone of the chuck body, thus exemplary chuck bodies may include a similar number or greater number of zones than heaters. The chucking electrodes 335 may be positioned between the heater 350 and the substrate support surface 327 in some embodiments. Chucking electrodes 335 may be embedded within a material that forms substrate support surface 327 in some embodiments, or a distance may be maintained between electrodes 335 and substrate support surface 327 in other embodiments.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, heater 350 may be operated to maintain a substrate temperature above at least 500° C. during deposition operations.

Figure 4:
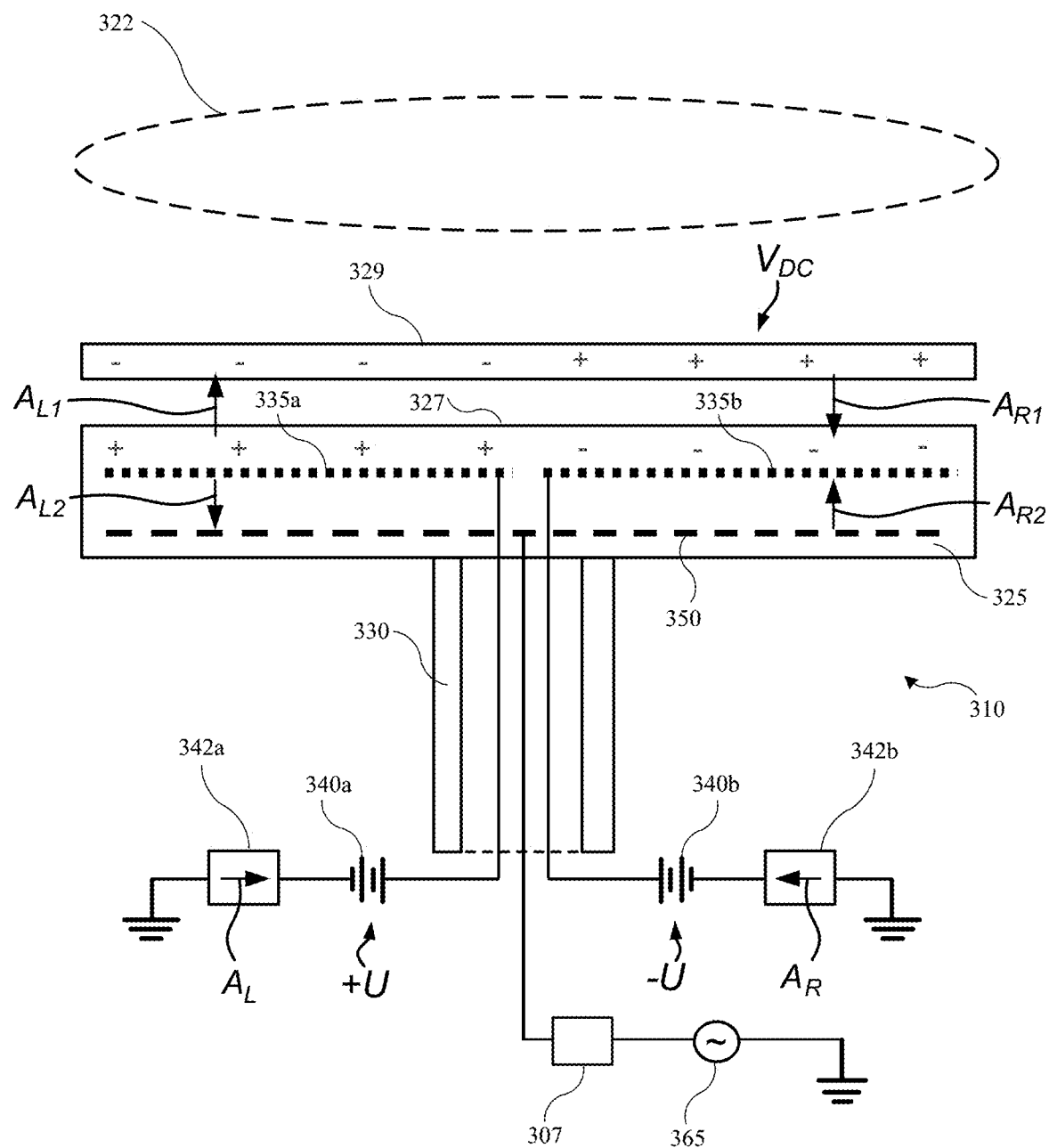
FIG. 4 is a schematic, partial cross-sectional view of selected components of a semiconductor processing system, according to one or more embodiments of the present technology.

FIG. 4 is a schematic, partial cross-sectional view of selected components of a semiconductor processing system, according to one or more embodiments of the present technology. FIG. 4 illustrates certain components already discussed in connection with FIG. 3, in schematic form to illustrate certain voltages and currents that pertain to the present technology. Power sources 340a and 340b are electrically coupled, respectively, with chucking electrodes 335a and 335b. Power and control connections to power sources 340a and 340b are not shown in FIG. 4, for clarity of illustration (see FIG. 3). When a substrate 329 is placed atop substrate support surface 327 of electrostatic chuck body 325, power sources 340a and 340b may be energized, supplying opposite voltages +U, −U respectively to chucking electrodes 335a and 335b. Voltages +U, −U induce respective positive and negative charges at surfaces of electrodes 335a and 335b (shown schematically in FIG. 4, just above electrodes 335a and 335b) which, in turn, induce charge redistribution within substrate 329. The opposite sets of charges attract one another, generating an electrostatic force that holds substrate 329 to substrate support surface 327. Typical magnitudes of U are in the range of tens of volts up to 1000 volts, or more.

In typical semiconductor processing, wafers such as substrate 329 may be transported in conductive cassettes, FOUPs, and the like, that may keep them grounded, to avoid static electricity discharges, and electric fields that would attract particles that may be present in their local environment. That is, $V_{DC}$ of substrate 329 may typically be zero between process steps, including when substrate 329 is initially placed atop substrate support surface 327. As long as the chucking voltages are equal and opposite relative to substrate 329—that is, +U, −U are on either side of ground, with $V_{DC}=0$—the chucking forces between each side of substrate 329 and electrodes 335a and 335b will be equal.

However, certain processes may cause $V_{DC}$ to be other than zero. In one example, when a plasma 322 is initiated, various mechanisms may cause $V_{DC}$ to deviate from zero. For example, if there is a DC bias between electrostatic chuck body 325 and a surrounding chamber, substrate 329 may act as a capacitive voltage divider between the two; also, charged particles of plasma 322 can provide their electrical charges to substrate 329. Some typical values of for certain plasma processes may be −30V to −50V, but other values outside this range may occur. Factors in plasma processing that may make $V_{DC}$ different from time to time include types of processing gases used in plasma 322, amount of RF power applied to ignite and/or sustain plasma 322, pressure of the plasma within the process chamber, material and backside conductivity of substrate 329, and operating temperature of substrate 329 (which may be, in turn, largely determined by temperature of electrostatic chuck body 325).

Furthermore, other types of processing that do not necessarily generate a plasma may also change $V_{DC}$, such as ion milling, ion implantation, and electron beam imaging and/or metrology. The techniques for reducing differences in coupling forces are usable with many such types of processing, and should be understood not to be limited to use with plasma processing.

Regardless of type of processing, when $V_{DC}$ is not zero and is significant with respect to +U, −U, the chucking voltages, and thus the chucking forces, between the sides of substrate 329 and electrodes 335a and 335b will be unbalanced. Chucking force may be proportional to the square of the chucking voltage, so for example, if chucking voltages exerted by two electrodes are unbalanced by a ratio of 2:1, the corresponding chucking forces may be unbalanced by a ratio of 4:1.

Figure 5:
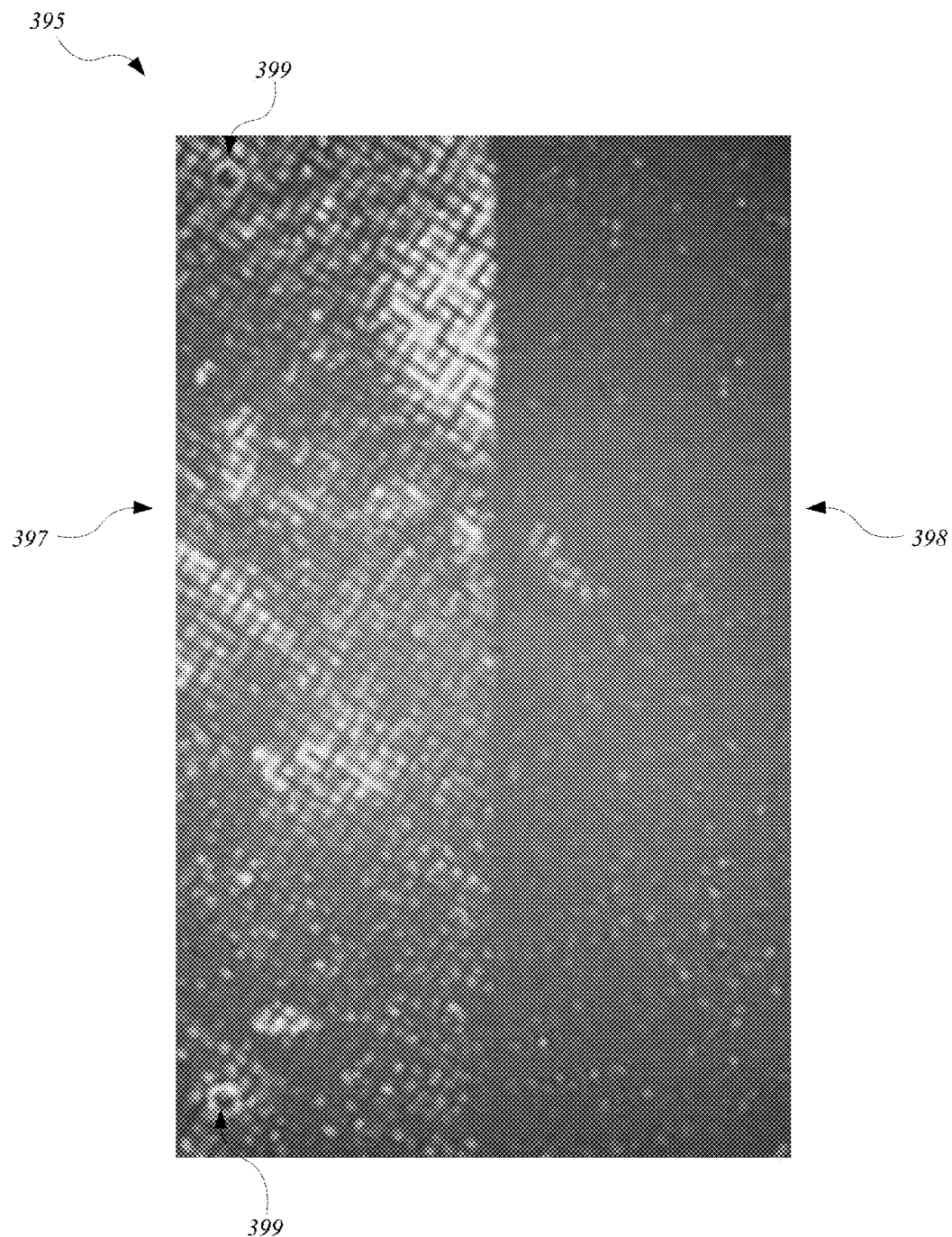
FIG. 5 shows a data image portion obtained on a semiconductor wafer with a bare wafer, light-based particle measurement system, according to some embodiments of the present technology.

FIG. 5 shows a data image portion 395 obtained on a semiconductor wafer with a bare wafer, light-based particle measurement system. The wafer on which data image portion 395 was taken, was subjected to unbalanced chucking forces. A wafer portion corresponding to left side 397 of data image portion 395 experienced a very high chucking force, while a wafer portion corresponding to right side 398 experienced a much lower chucking force. Dark portions of data image portion 395 correspond to nothing being detected by the particle measurement system, while a white dot is displayed at every location where some light-scattering feature is "seen" by the system. The data image was taken on a polished silicon test wafer placed face down on an electrostatic chuck, subjecting the wafer to unbalanced chucking forces, removing the wafer and evaluating the polished face with the particle counter. Thus, the white areas represent light-scattering artifacts other than the polished silicon surface. These areas could be, for example, foreign matter stuck to the surface of the wafer, actual damage to the wafer, or some combination of the two. Both are undesirable in high precision processing of semiconductors or other devices made with semiconductor processing technology. Damage to a wafer can lead to various failure mechanisms in circuitry, and even particles on wafer backsides can lead to damage or nonuniform processing. For example, when a wafer is pulled strongly to a chuck with the particle forcing one area out of contact with the chuck, the wafer may be mechanically damaged, or an area around the particle may not have the same thermal coupling to the chuck as the rest of the wafer, or the area around the particle may be pushed out of the focal plane of a lithography system, resulting in misprinted circuit features. In the case of left side 397, FIG. 5, a grid pattern is visible, corresponding to a pattern of a heater grid in the chuck that exerted the unbalanced chucking forces. Also, detectable irregularities left by lift pins of the wafer chuck are visible at two locations marked 399.

Given that some light-scattering features are visible even in right side 398 of data image portion 395, evaluation with a bare wafer, light-based particle measurement system is believed to be a useful characterization tool to determine when chucking forces are balanced. When a wafer is subjected to balanced chucking forces, the two sides of an evaluated wafer will appear about the same, while when subjected to unbalanced forces, some difference in light-scattering features may be evident. However, evaluation with such a tool may require removing the wafer from the processing system for measurement. It may be helpful to have some way to balance chucking forces while a substrate is in a processing system.

Returning to the discussion of FIGS. 3 and 4, if $V_{DC}$ during processing can be measured or at least estimated, the chucking voltages can be adjusted by some amount, in order to reduce the mismatch in chucking forces. Advantageously, this measurement or estimation should take place in real time, in the processing system. In an ideal case, that is, when $V_{DC}$ can be estimated accurately and there are no significant constraints on DC voltages that can be provided to chucking electrodes 335a and 335b, the voltages on 335a and 335b will be adjusted by the amount of $V_{DC}$, in opposite polarity on 335a and 335b, to make the magnitude of the voltage difference between each chucking electrode and $V_{DC}$ the same.

In some substrate processing systems, $V_{DC}$ may be measured by using a DC probe that contacts the underside of substrate 329. However, processing performed by certain systems may be destructive to DC probes; specifically, for systems that perform cleaning operations with the process chamber empty (e.g., with no substrate 329 present). It is also possible to measure $V_{DC}$ with a Langmuir probe, and this can be done readily in a laboratory environment, however such probes are expensive and also susceptible to damage, making them relatively costly and/or difficult to use in a production environment.

Some embodiments of the present technology involve determining or at least estimating $V_{DC}$ with plasma 322 on, without using a DC or Langmuir probe. These embodiments estimate $V_{DC}$ based on measurements of leakage currents from one or both of electrodes 335a and 335b. These currents may be quite significant, especially when processing temperature is relatively high, and for large substrate sizes. For example, for an electrostatic chuck that positions a nominal 300 mm/12 inch wafer, and operates above 500° C., the leakage currents per electrode may be tens of milliamps, while for the same size chuck operating above 600° C., the leakage currents per electrode may be hundreds of milliamps. As illustrated in FIG. 4, the current AL from power source 340a, which supplies +U voltage to electrode 335a, includes leakage currents $A_{L1}$ from electrode 335a to substrate 329, and $A_{L2}$ from electrode 335a to other components of electrostatic chuck body 325, notably heater 350. The current $A_R$ from power source 340b, which supplies voltage −U to electrode 335b, includes leakage currents $A_{R1}$ from electrode 335b to substrate 329, and $A_{R2}$ from electrode 335b to other components of electrostatic chuck body 325, notably heater 350. Thus, $$A_L = A_{L1} + A_{L2} \qquad \text{Eq. 1}$$

$$A_R = A_{R1} + A_{R2} \qquad \text{Eq. 2}$$

Each of the currents noted is driven by electric fields between neighboring conductors, which are in turn related to known voltages. Thus, when $V_{DC}=0$, and with no DC bias on electrostatic chuck body 325, $$A_{L1} \propto U^2 \qquad \text{Eq. 3}$$

$$A_{L2} \propto U^2 \qquad \text{Eq. 4}$$

$$A_{R1} \propto U^2 \qquad \text{Eq. 5}$$

$$A_{R2} \propto U^2 \qquad \text{Eq. 6}$$

When plasma 322 is present, $V_{DC}$ becomes nonzero. Using the symbol A* to denote the same currents noted above, when $V_{DC}$ is nonzero:

$$A^*_L = A^*_{L1} + A^*_{L2} \qquad \text{Eq. 7}$$

$$A^*_R = A^*_{R1} + A^*_{R2} \qquad \text{Eq. 8}$$

Leakage currents $A^*_{L1}$ and $A^*_{R1}$ may be significantly different from $A_{L1}$ and $A_{R1}$ when $V_{DC}$ is nonzero, because the voltages of these currents will change in opposite directions:

$$A^*_{L1} \propto (U - V_{DC})^2 \qquad \text{Eq. 9}$$

$$A^*_{R1} \propto (U + V_{DC})^2 \qquad \text{Eq. 10}$$

However, leakage currents $A^*_{L1}$ and $A^*_{R1}$ may not be significantly different from $A_{L1}$ and $A_{R1}$ when $V_{DC}$ is nonzero, because the voltages driving them do not change:

$$A^*_{L2} = A_{L2} \propto U^2 \qquad \text{Eq. 11}$$

$$A^*_{R2} = A_{R2} \propto U^2 \qquad \text{Eq. 12}$$

Thus, by subtracting each A from its corresponding A* to obtain changes in either $A_R$ or $A_L$ when plasma 322 is present vs. when it is not, the $A_{L2}$ and $A_{R2}$ terms cancel out, and the changes will be strong functions of $V_{DC}$ (ignoring a second order cross-multiplication term):

$$\Delta A_L = A^*_L - A_L \propto (V_{DC})^2 \qquad \text{Eq. 13}$$

$$\Delta A_R = A^*_R - A_R \propto (-V_{DC})^2 \qquad \text{Eq. 14}$$

Thus, measurements of $A_L$ and $A_R$, and calculations of $\Delta A_L$ and $\Delta A_R$ from the measurements, should be usable to obtain at least an estimate of $V_{DC}$ in real time, while a substrate is processed. The proportionalities indicated in Equations 3-6 and 9-14 may or may not be perfect quadratic relationships. But if direct measurements of $V_{DC}$ can be obtained on a characterization basis using a DC or Langmuir probe while $A_L$ and $A_R$ are measured, in a chamber running a similar recipe to the one for which the $V_{DC}$ model is desired, then correlation between $V_{DC}$ and changes in $A_L$ and $A_R$ can be established. For example, some embodiments may store a model or mathematical formula for $V_{DC}$ as a function of $\Delta A_L$ and/or $\Delta A_R$, or may store a lookup table. It should be noted that either, or both, of $\Delta A_L$ and/or $\Delta A_R$ can be measured and used to calculate or estimate $V_{DC}$. In some embodiments, economy may favor using only one of $\Delta A_L$ or $\Delta A_R$ because only one ammeter would need to be installed and used, but in other embodiments, accuracy and ability to handle more diverse process situations may favor using both of $\Delta A_L$ and $\Delta A_R$.

Variations in how U, −U are adjusted are also possible. As noted above, in an ideal case, the chucking voltages will be adjusted by the amount of $V_{DC}$, in opposite polarity on 335a and 335b, to make the magnitude of the voltage difference between each chucking electrode and $V_{DC}$ the same. However, the ideal case conditions may not always be met, for example in cases where power sources run up against voltage driving limits, or other circumstances in a process chamber make such voltage adjustments problematic. Therefore, in some embodiments, a model or lookup table that supplies adjustment values for U, −U also, optionally, may scale the intended correction, add or subtract a DC offset, compensate for voltage driving limits, and/or include corrections for other variables such as temperature of the electrostatic chuck body. In still other embodiments, if chucking force mismatches can be directly correlated with $\Delta A_L$ and/or $\Delta A_R$, at least a first order model of desired chucking voltage adjustments can be generated without explicitly estimating $V_{DC}$. For example, desired corrections for the chucking voltages can simply be made by running test wafer experiments with different chucking voltages while measuring $A_L$ and $A_R$, and using light-scattering artifact data like that shown in FIG. 5 to determine optimum chucking voltages. Certain embodiments may adjust only one chucking voltage (e.g., the voltage provided to only one of chucking electrodes 335a, 335b) in order to get first order improvement in chucking force imbalance.

Then, in a production environment, a controller can be configured to control the power sources to the electrodes, receive measurements of $A_L$ and/or $A_R$ before and after a process is initiated, optionally receive other data such as temperature, optionally calculate $\Delta A_L$ and/or $\Delta A_R$, optionally generate at least an estimate of $V_{DC}$, calculate a desired correction for a chucking voltage of at least one of the electrodes, and control the power sources to implement the correction. The controller may be controller 380; the power sources may be power sources 340a and/or 340b; the current measurements may also be provided by power sources 340a and/or 340b, or may be provided by separate ammeters 342a and/or 342b; all as shown in FIG. 3.

Various modifications of the technologies disclosed above are possible. For example, in some embodiments, it may be sufficient to use measured $A_L$ and/or $A_R$ alone (e.g., as arguments for a lookup function) to determine a modified chucking voltage directly, or it may desired to explicitly calculate $\Delta A_L$, $\Delta A_R$ and/or $V_{DC}$. In another example, although both chucking voltages will usually be adjusted by similar voltage magnitudes in opposite directions to balance chucking forces, in some embodiments it is possible to adjust only one chucking voltage to obtain a benefit. Also, in some embodiments, $V_{DC}$ and/or modified chucking voltage(s) may be determined based on only one of $A_L$ or $A_R$ measurements, while other embodiments may consider $V_{DC}$ and/or modified chucking voltage(s) to be more accurately determined by using both of $A_L$ and $A_R$. In these and other embodiments, any of $A_L$ and $A_R$ measurements, $V_{DC}$ estimates, initial chucking voltages, and/or modified chucking voltages for each substrate processed may be stored, transmitted to a network, and/or otherwise used for statistical process control purposes. Upon reading and understanding the present disclosure, one skilled in the art will readily conceive of various equivalents, extensions, variation and/or modifications of the specific techniques discussed.

Figure 6:
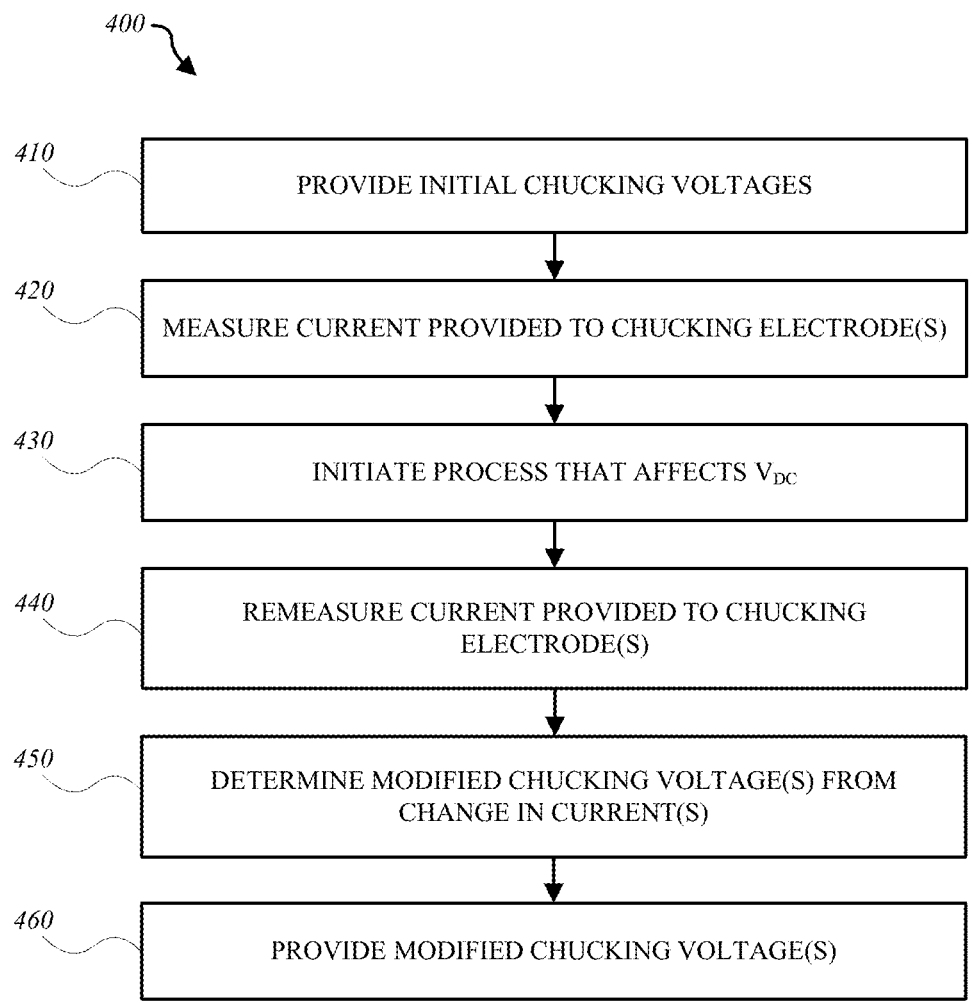
FIG. 6 is a flowchart of a method for reducing differences in chucking forces that are applied by two electrodes of an electrostatic chuck, to a substrate disposed atop the chuck, according to one or more embodiments of the present technology.

FIG. 6 is a flowchart of a method 400 for reducing differences in chucking forces that are applied by two electrodes of an electrostatic chuck, to a substrate disposed atop the chuck, according to one or more embodiments of the present technology. At 410, method 400 provides initial chucking voltages to at least two electrodes of a bipolar electrostatic chuck. An example of 410 is power sources 340a and 340b providing initial chucking voltages to each of electrodes 335a and 335b (FIG. 3 or 4) while a substrate 329 is atop electrostatic chuck body 325. At 420, method 400 measures an initial current provided to one or both of the chucking electrodes; as discussed above, in some cases measuring only one such current may suffice, or it may be considered more accurate, or otherwise useful, to measure both currents. Examples of 420 include controller 380, FIG. 3, receiving current measurements from ammeters built into power sources 340a and/or 340b, or from separate ammeters 342a and/or 342b, FIG. 3.

At 430, a process that affects $V_{DC}$ is initiated. Examples of such process are, at least, a plasma process, an ion milling process, an ion implantation process, and/or an electron beam based imaging and/or metrology process. At 440, method 400 remeasures current provided to one or both of the chucking electrodes. As discussed above, either one or both currents may be remeasured, and may be considered modified currents (e.g., modified by the process that affects $V_{DC}$, at 430). Examples of 440 include controller 380, FIG. 3, receiving current measurements from ammeters built into power sources 340a and/or 340b, or from separate ammeters 342a and/or 342b, FIG. 3. At 450, at least one modified chucking voltage is determined from the current measurements from 420 and 440. An example of 450 is controller 380, FIG. 3 determining at least one modified chucking voltage based at least in part on the initial current and the modified current measured at 420 and 440. Optional substeps and/or variations of 450 include explicitly calculating $\Delta A_L$, $\Delta A_R$ and/or $V_{DC}$ from the initial current(s) and the modified current(s); using a lookup table to determine $V_{DC}$ and/or the modified chucking voltage; using a stored formula to determine $V_{DC}$ and/or the modified chucking voltage; determining modified chucking voltages for both chucking electrodes; and storing any of the input data and/or calculated values for later use. At 460, the at least one modified chucking voltage is provided to the appropriate electrode. A frequent, but still optional, variation of 460 is to provide modified chucking voltages to both electrodes. Examples of 460 are controller 380 providing commands to power source(s) 340a and/or 340b to provide the corrected chucking voltage(s).

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of reducing differences in chucking forces that are applied by two electrodes of an electrostatic chuck, to a substrate disposed atop the chuck, the method comprising:

providing initial chucking voltages to each of the two electrodes;

measuring an initial current provided to a first electrode of the two electrodes prior to initiating a process that affects a DC voltage of the substrate;

initiating the process that affects the DC voltage of the substrate;

after the process is initiated, measuring a modified current provided to the first electrode;

determining, based at least on the initial current and the modified current, a modified chucking voltage for a selected one of the two electrodes, that will reduce chucking force imbalance across the substrate; and providing the modified chucking voltage to the selected one of the two electrodes.

2. The method of claim 1, wherein measuring the initial current and the modified current comprises using current readings provided by an ammeter integrated with a power source that provides the initial chucking voltage to the first electrode.

3. The method of claim 1, wherein measuring the initial current and the modified current comprises using an ammeter that is coupled in electrical series connection between (a) a power source that provides the initial chucking voltage to the first electrode, and (b) the first electrode.

4. The method of claim 1, wherein determining the modified chucking voltage comprises using a lookup table.

5. The method of claim 1, wherein determining the modified chucking voltage comprises calculating the modified chucking voltage using a formula that uses the initial current and the modified current.

6. The method of claim 1, wherein determining the modified chucking voltage comprises determining an approximate change in the DC voltage of the substrate that is caused by the process.

7. The method of claim 1, wherein:
measuring the initial current comprises:
measuring the initial current to the first electrode as a first initial current, and
measuring the initial current to a second electrode of the two electrodes as a second initial current;
measuring the modified current provided to the first electrode comprises:
measuring the modified current to the first electrode as a first modified current, and
measuring the modified current to the second electrode as a second modified current; and
determining the modified chucking voltage for the selected one of the two electrodes comprises determining the modified chucking voltage based at least on the first initial current, the second initial current, the first modified current and the second modified current.

8. The method of claim 7, wherein:
determining the modified chucking voltage for the selected one of the two electrodes comprises determining the modified chucking voltage as a first modified chucking voltage, and determining a modified chucking voltage for the non-selected one of the two electrodes as a second modified chucking voltage;

and the method further comprises providing the second modified chucking voltage to the non-selected one of the two electrodes.

9. The method of claim 8, wherein determining the first modified chucking voltage and the second modified chucking voltage comprises:
estimating a DC voltage of the substrate based on at least on the first initial current, the second initial current, the first modified current and the second modified current; and
adjusting the initial chucking voltages by voltage amounts that are based at least in part on the estimated DC voltage of the substrate, to form the modified chucking voltages.

10. The method of claim 9, wherein adjusting the initial chucking voltages comprises adjusting each of the initial chucking voltages by a voltage amount that is equal to the estimated DC voltage of the substrate, to form the modified chucking voltages.

11. The method of claim 1, further comprising:
evaluating DC voltage changes on a test substrate that is subjected to the process, while measuring currents provided to chucking electrodes; and
generating a lookup table or a model for use in determining the modified chucking voltage.

12. The method of claim 11, wherein evaluating the DC voltage changes comprises utilizing a DC probe or a Langmuir probe.

13. The method of claim 11, wherein evaluating the DC voltage changes comprises:
placing a polished side of a test wafer on the electrostatic chuck;
initiating the process;
removing the test wafer; and
evaluating the polished side of the test wafer with a light-based particle measurement system, to detect light-scattering artifacts induced by the electrostatic chuck.

* * * * *